(12) United States Patent
Von Koblinski et al.

(10) Patent No.: US 10,431,471 B2
(45) Date of Patent: Oct. 1, 2019

(54) METHOD OF PLANARIZING A SEMICONDUCTOR WAFER AND SEMICONDUCTOR WAFER

(71) Applicant: Infineon Technologies AG, Neubiberg (DE)

(72) Inventors: Carsten Von Koblinski, Villach (AT); Markus Ottowitz, Arnoldstein (AT); Andreas Riegler, Lichtpold (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/137,012

(22) Filed: Apr. 25, 2016

(65) Prior Publication Data

US 2016/0315154 A1    Oct. 27, 2016

(30) Foreign Application Priority Data

Apr. 27, 2015  (DE) .................. 10 2015 106 441

(51) Int. Cl.
| | |
|---|---|
| *H01L 21/308* | (2006.01) |
| *H01L 21/304* | (2006.01) |
| *H01L 21/302* | (2006.01) |
| *H01L 21/306* | (2006.01) |
| *H01L 21/3065* | (2006.01) |

(52) U.S. Cl.
CPC .......... *H01L 21/308* (2013.01); *H01L 21/302* (2013.01); *H01L 21/3065* (2013.01); *H01L 21/3083* (2013.01); *H01L 21/30604* (2013.01); *H01L 21/30625* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,320,708 A | * | 6/1994 | Kadomura | ........ H01L 21/02063 257/E21.218 |
| 5,585,661 A | * | 12/1996 | McLachlan | ....... H01L 21/76264 257/506 |
| 5,885,900 A | * | 3/1999 | Schwartz | ............ H01L 21/3212 438/697 |
| 6,025,270 A | * | 2/2000 | Yoo | ................... H01L 21/31053 216/57 |
| 6,552,812 B1 | * | 4/2003 | Xu | ...................... G01B 11/0616 356/369 |
| 6,979,632 B1 | * | 12/2005 | Ohtani | ................ H01L 21/2022 438/487 |
| 7,288,418 B2 | * | 10/2007 | Barge | ................... H01L 21/306 257/E21.214 |

(Continued)

OTHER PUBLICATIONS

Streetman, Ben G. Solid State Electronic Devices. Sixth Edition. p. 166. Upper Saddle River, New Jersey: Pearson Prentice Hall. 2006. (Year: 2006).*

*Primary Examiner* — Michelle Mandala
*Assistant Examiner* — Jordan M Klein

(57) ABSTRACT

Various embodiments provide a method of planarizing a semiconductor wafer, wherein the method comprises providing a semiconductor wafer comprising a surface; and forming a mask layer on the surface of the semiconductor wafer, wherein a thickness of the mask layer is smaller in thinning areas, which are to be thinned for planarizing, than in areas which are not to be thinned for planarizing.

8 Claims, 3 Drawing Sheets

(56) References Cited

U.S. PATENT DOCUMENTS

| | | | |
|---|---|---|---|
| 2005/0113011 A1* | 5/2005 | Miyauchi | B24B 37/205 |
| | | | 451/527 |
| 2010/0233871 A1* | 9/2010 | Chuang | H01L 21/26513 |
| | | | 438/527 |
| 2011/0256730 A1* | 10/2011 | Riou | H01L 21/302 |
| | | | 438/759 |
| 2012/0083125 A1* | 4/2012 | Charns | H01L 21/31053 |
| | | | 438/697 |

* cited by examiner

METHOD OF PLANARIZING A SEMICONDUCTOR WAFER AND SEMICONDUCTOR WAFER

TECHNICAL FIELD

Various embodiments relate to a method of planarizing a semiconductor wafer and to a semiconductor wafer.

BACKGROUND

In the field of manufacturing processes of semiconductor elements the semiconductor elements are often processed on a wafer scale. With the proceeding of the technology often so called thin film wafer are used even in the field of power modules, i.e. modules comprising semiconductor elements or chips designed for withstanding high voltages or currents. These power modules are used in rectifiers or inverters in the automotive sector, for example. For reducing the thickness of the chips, e.g. transistors or diodes, the bulk of the wafer itself is often used for providing or defining the inverse or block voltage. As a general rule each 1 micrometer of thickness corresponds to 10 V inverse voltage.

However, due to the fact that the bulk or thickness of the wafer itself and not of an (epitaxial) deposited layer defines the block voltage, variations in the thickness of the wafer directly correspond to a variation of the blocking voltages and thus directly effects the performance of the electronic element or component. Therefore, the total thickness variation (TTV) of the bulk wafer should be as low as possible. Therefore a plurality of complex measures are performed in the prior art to reduce the TTV.

SUMMARY

Various embodiments provide a method of planarizing a semiconductor wafer, wherein the method comprises providing a semiconductor wafer comprising a surface; and forming a mask layer on the surface of the semiconductor wafer, wherein a thickness of the mask layer is smaller in thinning areas, which are to be thinned for planarizing, than in areas which are not to be thinned for planarizing.

Furthermore, various embodiments provide a semiconductor wafer for a power module, comprising a semiconductor layer comprising a surface; and a mask layer arranged on the surface of the semiconductor wafer, wherein the mask layer comprises thick portions and thin portions wherein the differences of the thick portions and the thin portions is in the range between 50 nanometer and 1 micrometer.

Furthermore, various embodiments provide a planarized semiconductor wafer comprising a semiconductor layer having a total thickness variation of less than 3 micrometer.

BRIEF DESCRIPTION OF THE DRAWINGS

In the drawings, like reference characters generally refer to the same parts throughout the different views. The drawings are not necessarily to scale. Instead emphasis is generally being placed upon illustrating the principles of the invention. In the following description, various embodiments are described with reference to the following drawings, in which.

DETAILED DESCRIPTION

Figure 1:
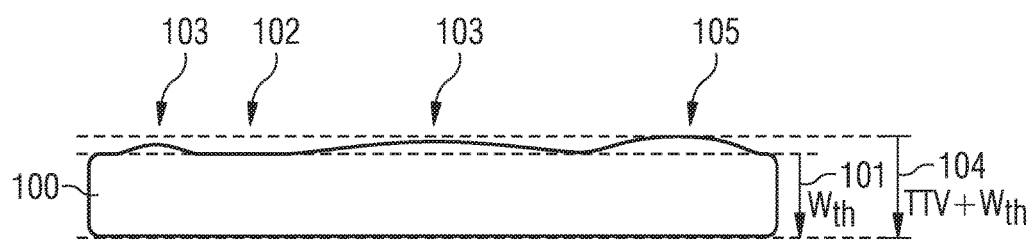
FIG. 1 schematically shows a cross sectional view of a semiconductor wafer.

In the following further exemplary embodiments of a method of planarizing a semiconductor wafer are described. It should be noted that the description of specific features described in the context of one specific exemplary embodiment may be combined with others exemplary embodiments as well.

The word "exemplary" is used herein to mean "serving as an example, instance, or illustration". Any embodiment or design described herein as "exemplary" is not necessarily to be construed as preferred or advantageous over other embodiments or designs.

Various exemplary embodiments provide a method of planarizing a semiconductor wafer wherein a (pre-planarized) semiconductor wafer is provided, wherein on a (pre-planarized) surface of the semiconductor wafer a mask layer is formed having different thicknesses corresponding to the thickness variations of the semiconductor wafer in that way that on thicker portions or areas of the semiconductor wafer the mask layer is thinner, while on thinner areas or portions of the semiconductor wafer the mask layer is thicker. In particular, the mask layer may be even opened in the areas of the semiconductor wafer having the greatest thickness.

In particular, the surface may be a pre-planarized surface. In particular, the areas to be thinned in a planarizing steps may be particularly areas which are thicker than a predetermined threshold. It should be noted that the greater thickness or the thickness in general may be the total thickness of the wafer stack including the wafer itself and optional carriers, adhesion layers or the like. In particular, the areas to be thinned may correspond to areas having a greater height or thickness, e.g. forming projections, bumps or elevated regions having some (area or planar) extension.

In particular, the term "pre-planarized" may particularly denote the fact that some planarizing process has already been performed in order to provide a coarse smoothing or planarizing. For example, a (mean) total thickness variation of the pre-planarized wafer may be below a given threshold, e.g. below 10 micrometer (distance between maximal height to minimal height), preferably below 5 micrometer, while the TTV of the finally planarized semiconductor wafer may be even below 3 micrometer, e.g. between 1 micrometer and 2 micrometer.

It should be noted that a material of the mask layer may be preferably chosen to provide a difference in mechanical, physical and/or chemical properties or characteristics with respect to the material of the semiconductor wafer. Thus, a selective removing of the mask layer and the materials of the semiconductor wafer may be facilitated. Therefore a fine planarization may be enabled due to the provision of a mask layer having different heights depending on the total thickness of the wafer on which the mask layer is formed.

In particular, the mask layer may be an inhomogeneous layer (with respect to the thickness) and may comprise areas or regions having a greater thickness and areas or regions having a smaller thickness. For example, the differences in thickness of the thickest areas and the thinnest areas may be in the range of 10 nanometer to 1 micrometer, in particular, in the range of 50 nanometer to 500 nanometer, e.g. in the range of 80 nanometer and 300 nanometer. It should be mentioned that these numbers denote the difference and not the absolute thickness, since preferably the "thinnest" areas of the mask layer may be opened areas, i.e. having no remaining mask layer material arranged at top. Depending on the starting thickness of the mask layer the thickest areas may be in the range of 80 nm for 150 nm remaining mask thickness, while for 600 nm initial mask thickness the thickest areas may be in the range of 350 nanometer (while the thinnest areas may be opened).

By providing a semiconductor wafer having arranged a mask layer thereon with different thicknesses it may be possible that the below arranged semiconductor layer is protected to a different amount in subsequent planarization steps (independent whether these are chemical and/or mechanical and/or physical) so that the semiconductor layer may be planarized by removing different amounts of the semiconductor layer in the planarization step. In general exemplary embodiments may provide methods of reducing local total thickness variations (TTV). Thus, it may be possible to provide a semiconductor wafer having a smaller (mean) TTV than providable by common methods.

These common methods may be affected by some of the following inaccuracies (which may be overcome partially by exemplary embodiments): already the thickness of a supporting carrier may vary and variations of the thicknesses of adhesion layers may influence the TTV as well as the variations in the thickness of the wafer itself. For reducing the influence very complex and costly processes are used in common manufacturing methods, e.g. very exact setting of manufacturing facilities, automatic process monitoring and controlling, use of very specific facilities (tailored to very specific wafer topologies), high measurement or monitoring efforts. Contrary to these very complex and possibly costly common processes the reduction of the TTV, when using a method according to an exemplary embodiment, may be performed by some kind of self-adjusting process.

However, it should be mentioned that these common methods may be preferably applied before the (fine) planarization method according to an exemplary embodiment is applied to such a (pre-planarized) semiconductor wafer.

In the following exemplary embodiments of the method of planarizing a semiconductor wafer are described. However, the features and elements described with respect to these embodiments can be combined with exemplary embodiments of the semiconductor wafer.

According to an exemplary embodiment the method further comprises removing material of the semiconductor wafer in the thinning areas.

In particular, the (semiconductor) material of the semiconductor wafer may be preferably removed (or may be removed to a greater extend) in the thinning areas on which the mask layer is removed or at least thinned. Thus, it may be eased that the material of the semiconductor wafer is removed to a greater extend, so that a fine planarization may be enabled.

According to an exemplary embodiment of the method the removing of the material of the semiconductor wafer is performed by a process selected out of the group consisting of: dry etching; wet etching; dry polishing; and wet polishing.

According to an exemplary embodiment of the method the forming of the mask layer comprises forming a raw mask layer and subsequently removing portions of the raw mask layer in the thinning areas.

In particular, the raw mask layer may have a (substantially) homogenous thickness. However, afterwards a greater amount or thickness of raw mask material may be removed in the thinning areas than in the other areas. In particular, the removing may be an inhomogeneous removing, i.e. from some areas or regions of the wafer a greater amount of raw mask material may be removed than from other areas or regions. Thus, some areas or regions of the semiconductor wafer may be exposed or nearly exposed while others are still covered by the (protective) mask layer. The raw mask layer may be formed by a single layer or a plurality of layers, wherein the raw mask layer or a raw mask layer stack may be formed or deposited on the semiconductor wafer (either directly or including intermediate layer(s)).

Preferably, the removing process or step (forming the mask layer from the raw mask layer) may be a self-adjusting process, i.e. a process (more or less) automatically removing a greater amount of mask material from the areas or regions from which a greater amount of semiconductor material of the wafer should be removed afterwards.

In particular, the removing of portions of the raw mask layer may be achieved by some kind of selective or inhomogeneous process. It should be noted that in some areas the mask layer may be totally removed, in other areas the mask layer may be partially removed, while in others the mask layer may be unchanged by the removing process or step. Thus, the raw mask layer may be partially opened to form the mask layer which may be used afterwards in a fine planarization step or process. In particular, the remaining areas of the raw mask layer, which form the mask layer, may protect the underlying areas of the semiconductor wafer in later process steps.

According to an exemplary embodiment of the method the raw mask layer is formed by a stack of sub layers.

In particular, the sub layers may have different mechanical, physical and/or chemical properties. Thus, the raw mask layer may be formed by a stack of different sub layers. The chemical and/or mechanical properties may be adapted or chosen according to the later process, e.g. with respect to an optimized selectivity with respect to the semiconductor material of the wafer. Thus, the planarizing may be optimized by choosing a suitable single mask layer or by choosing a suitable material combination for the stack of sub layers.

According to an exemplary embodiment of the method the removing is performed by a polishing process.

In particular, the polishing process may be a dry polishing process or may be a wet polishing process in which a slurry is used. Alternatively, the removing may be performed by a cutting or shearing-off process removing an upper portion or part of the raw mask layer from the surface. For example, the polishing process may be a dishing process.

According to an exemplary embodiment of the method the polishing process is performed by applying a contact force below a predetermined threshold.

In particular, the force may be smaller than typical (contact) forces applied in polishing processes used for planarizing surfaces of semiconductor (e.g. silicon) wafers. For example, typical commonly used forces may be in the range of 1,300 to 2,200 N (for 8 inch wafers) while according to exemplary embodiments the (contact) force may be in the range between 200 N and 1,200 N (for 8 inch wafers), in particular, between 450 N and 1,000 N. It should be noted that in particular the use of such (relatively) low (contact) force may enable or result in a self-adjusting process.

In particular, the higher or elevated areas of the raw mask layer (corresponding to the higher or thicker portions of the semiconductor wafer) may be primarily removed, while the lower areas may be removed in a smaller amount. Thus, when originally a raw mask layer having a (substantially) homogenous thickness is formed the mask layer may be removed to a greater extend in the higher areas, which have to be thinned, than in the lower areas, which should not be removed or at least only to a smaller degree in order to provide a fine planarization of the surface of the wafer. This may be caused by the fact that the higher areas are contacted first by the polishing pad and the applied force is then concentrated in a smaller region resulting in a higher (contact) pressure at these firstly contacted areas and possibly resulting in a higher abrasive effect there, which may be reduced afterwards in case a greater portion of the total area of the mask layer and/or semiconductor wafer is contacted after some removing or abrasion has taken place.

According to an exemplary embodiment of the method the polishing is performed by a polishing pad having a hardness of at least 50 Shore D.

In particular, the hardness may be above 55 Shore D, i.e. the polishing pad may be a hard polishing pad in contrast to commonly used soft polishing pads, which have a hardness in the range of up to 45 Shore D.

According to an exemplary embodiment of the method the forming of the raw mask layer may be performed by forming a layer comprising at least one material out of the group consisting of: a nitride; an oxide; a metal; ceramics; and a mixture thereof.

For example, a stack of a plurality of sub-layers may be formed when forming the mask layer. In particular, an oxide layer may be formed by oxidizing the wafer material. In particular, the material (of the surface) of the semiconductor layer may be chemically transformed, e.g. oxidized and/or nitrified, to form the material of the raw mask layer, which can afterwards be further processed, e.g. partially removed, to form the mask layer. However preferably, the oxide, e.g. silicon oxide, or nitride, e.g. silicon nitride, may be formed by depositing the oxide or nitride directly on the semiconductor wafer.

In particular such an oxide layer and/or nitride layer may form a (hard) mask layer which is selective with respect to the (modified) semiconductor material of the wafer. The selectivity may be given by different mechanical properties, e.g. hardness, and/or chemical properties, e.g. selectivity with respect to specific etching agents (e.g. tetramethylammonium hydroxide (TMAH) or KOH) or slurry compositions of a wet polishing process.

In general every material may be suitable for the mask layer which can be deposited in a thin layer. In particular, the material the mask is formed of should provide different chemical, mechanical and/or physical properties than the semiconductor material of wafer.

According to an exemplary embodiment of the method the mask layer forms a hard mask.

In a broad sense the term "hard mask" may particularly denote a mask comprising or consisting of a material or a material composition which is selectively with respect to the material of the semiconductor wafer. That is, the material of the hard mask and thus the hard mask itself may have a greater strength compared to the semiconductor material of the semiconductor wafer, e.g. may be harder.

According to an exemplary embodiment the method further comprises chemically modifying the semiconductor material of the wafer in the thinning areas.

In particular, the semiconductor material, e.g. silicon, may be oxidized or nitrified in a chemical process, e.g. by applying a plasma. Since the mask layer is thinner or even removed in the thinning areas in particular the semiconductor material in the thinning areas is modified to a greater extend, e.g. thickness, than in the other areas or regions. Thus, it may be possible to remove selectively the modified semiconductor material, e.g. silicon oxide or silicon nitride, afterwards. Therefore a fine planarization may be enabled.

According to an exemplary embodiment the method further comprises removing remaining portions of the mask layer.

The removing of the remaining portions of the mask layer may be particularly performed after the partially removing of the material of the semiconductor wafer in the thinning areas. This removing step of the remaining portions of the mask layer may form some kind of cleaning step after the fine planarization and may expose the semiconductor material of the semiconductor wafer again. For example, this removing step may be performed by an etching process, e.g. a dry etching and/or wet etching process using HF, for example.

In the following exemplary embodiments of the semiconductor wafer are described. However, the features and elements described with respect to these embodiments can be combined with exemplary embodiments of the method of planarizing a semiconductor wafer.

According to an exemplary embodiment of the semiconductor wafer the total thickness variation is below 3 micrometer.

In particular, the TTV may be below 2 micrometer, e.g. between 1 and 2 micrometer or even between 0.5 micrometer and 2 micrometer. For example, the term "total thickness variation" or TTV may be defined to be the thickness difference of a given region, in particular the total area or surface, of the planarized semiconductor wafer.

In the following specific embodiments of the method of planarizing a semiconductor wafer and a corresponding semiconductor wafer will be described in more detail with respect to the figures.

FIG. 1 schematically shows a cross sectional view of a semiconductor wafer 100. In particular, the semiconductor wafer 100 has a wafer thickness $W_{th}$ indicated by arrow 101, which corresponds to the minimal thickness of the wafer 100 and which is present in a first area 102. In a second area 103 the actual thickness of the wafer 100 is intermediate between the minimal thickness $W_{th}$ in the first area 102 and a maximal thickness $W_{th}+TTV$ (indicated by arrow 104) in a third area 105. It should be noted that in (the preferred) case that the wafer is already pre-planarized point-inhomogeneities are rather uncommon and extensive inhomogeneities (due to typically used polishing and/or etching) dominates.

Figure 2:
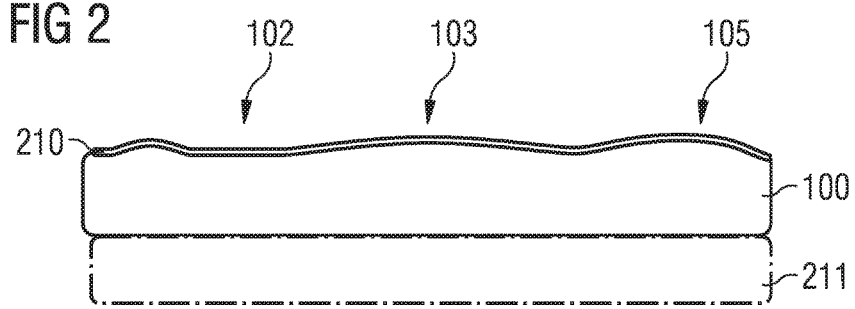
FIG. 2 schematically shows a cross sectional view of the semiconductor wafer of FIG. 1 after forming a raw mask layer.

FIG. 2 schematically shows a cross sectional view of the semiconductor wafer of FIG. 1 after forming a raw mask layer 210 on a surface of the wafer 100 of FIG. 1 and after attaching or mounting the wafer 100 to a support carrier 211. Such a support carrier 211 is typically used in the field of thin wafers in order to mechanically support the thin wafer having a thickness of below 100 micrometer, e.g. in the range of 50 to 60 micrometer. The raw mask layer 210 may be formed directly on the semiconductor layer 100, e.g. by depositing a ceramic material (e.g. an oxide or nitride) or a metallic layer.

The thickness of the raw mask layer 210 may either be rather thin (e.g. below 1 micrometer or even below 800 nanometer) or be chosen depending on the actual TTV values. Preferably, the thickness of the raw mask layer may be in the range between $\frac{1}{1000}$ to $\frac{1}{10}$ or $\frac{1}{5}$ of the TTV and exceeding the same not more than ½ of the TTV. In general ceramic mask layers may be preferred. However, sometimes a metallic mask layer may be advantageous for a further processing of the planarized wafer afterwards.

It should be noted that according to the example given in the figures the total thickness variation is given only by variation of the wafer thickness (as indicated in FIG. 1). However, it should be mentioned that the TTV may as well be influenced by thickness variations of a support carrier (like the one shown in FIG. 2) and/or of intermediate layers, e.g. an adhesion layer.

Figure 3:
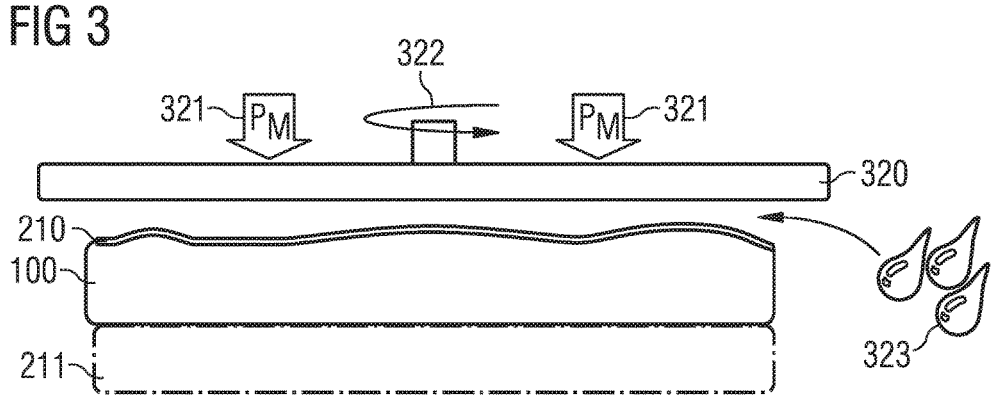
FIG. 3 schematically shows a cross sectional view of the semiconductor wafer of FIG. 2 during processing the raw mask layer.

FIG. 3 schematically shows a cross sectional view of the semiconductor wafer 100 including the raw mask layer 210 and the support carrier 211 and forming a stack structure of FIG. 2 during processing the raw mask layer. In particular, FIG. 3 shows the stack structure during a step in which a polishing pad 320 approaches the mask layer 210. The polishing pad 320 is pressed onto the surface of the raw mask layer 210 by a (mechanical) contact force $p_M$, indicated by the arrows 321 and rotates at the same time (indicated by arrow 322). The polishing process may be a dry polishing process or may be a wet polishing process as indicated by the schematic drops 323.

The polishing pad may be pressed onto the mask surface by a force in the range of 400 N to 1,000 N in the case of an 8 inch wafer, or 900 N to 2,250 N for a 12 inch wafer. While the force is relative low the firstly contacted higher areas of the raw mask layer 210 are contacted with a relative high contact pressure. This effect may be strengthened by using a relative hard and/or rigid polishing pad, e.g. having a Shore D value of more than 50 or even higher than 55.

Thus, the polishing pad may abrade primarily the higher areas (corresponding to thinning areas, i.e. areas to be thinned in order to reduce the TTV) of the raw mask layer 210. As soon as the polishing pad contacts a greater area or portion of the raw mask layer 210 the contact pressure will decrease and thus the abrasive effect will reduce or even vanish. Thus, a self-adjusting abrasive process may be enabled in an effective way.

In particular, the polishing pad may be slowly guided onto the wafer backside while only a relatively low force is applied to the polishing pad so that primarily the highest portions of the raw mask layer are removed.

Figure 4A:
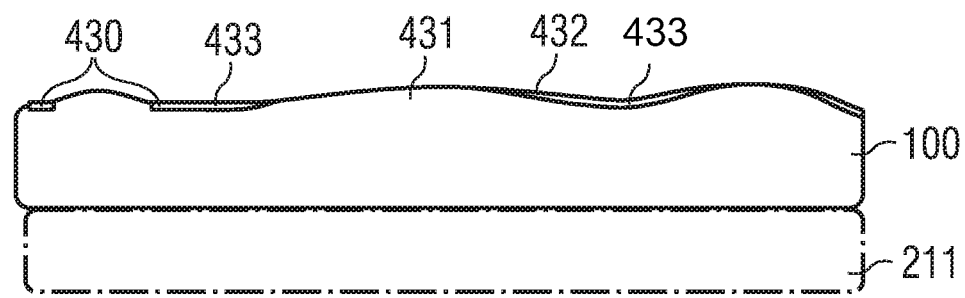
FIGS. 4A and 4B schematically show the semiconductor wafer of FIG. 3 after processing the raw mask layer in a cross sectional view and a top view, respectively.
Figure 4B:
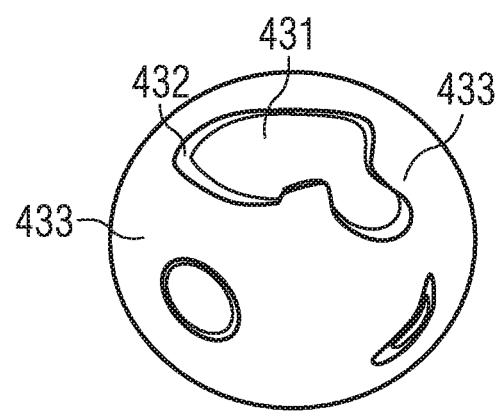

FIGS. 4A and 4B schematically show the semiconductor wafer (or stack structure) of FIG. 3 after processing the raw mask layer in an abrasive process to form a mask layer 430 in a cross sectional view and a top view, respectively. In particular, FIG. 4A shows a cross sectional view of the stack structure wherein the original raw mask layer is completely opened in some areas (431), in some other areas thinned (432) while in yet other areas remains unprocessed (433). The degree of opening the raw mask layer and exposing the below semiconductor wafer may be set by choosing the polishing time. Preferably the polishing time is quite short (due to the typically low raw mask thicknesses).

The different areas represent the different heights of the original wafer surface. In particular, the thickness of the (processed) mask layer may reflect the amount of semiconductor material to be removed in the respective area, wherein a greater amount of raw mask material remains in case less semiconductor material should be removed. The abrasive process may be a wet polishing (e.g. CMP) or a dry polishing process.

FIG. 4B schematically shows a top view of FIG. 4B and as well indicate the different areas 431, 432 and 433, in which the raw mask layer was completely opened, thinned or remains unchanged, respectively. In particular, the unchanged areas may effective protect the below semiconductor wafer in subsequent planarizing steps.

Figure 5A:
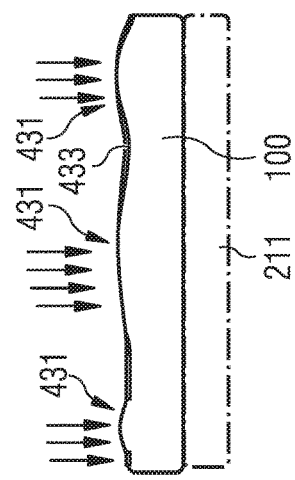
FIGS. 5A and 5B schematically show the semiconductor wafer of FIG. 4A after further processing steps according to an exemplary embodiment.
Figure 5B:
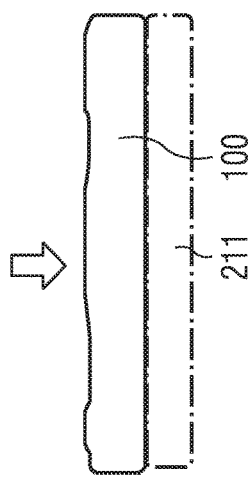

FIGS. 5A and 5B schematically show the semiconductor wafer of FIG. 4A after further processing steps according to an exemplary embodiment. In particular, FIG. 5A shows the stack structure of FIG. 4A after an oxidizing step leading to the forming of an oxide (e.g. a silicon oxide in case of a silicon wafer) 540 in the exposed or opened 431 areas. While the areas still covered by the mask layer 430 are protected from oxidization. Such an oxidization may be performed by applying an aqueous (semi-concentrated) nitric acid in a spin process.

In such an oxidization step the thickness of the oxide layer depends on the reaction time but is limited to a maximum thickness. Since the topologic (or thickness) differences between the opened and protected areas are quite small (e.g. about 2 micrometer to 3 micrometer) a relative small oxide layer thicknesses, (e.g. in the same thickness range of about 2 to 3 micrometer, or even below, e.g. in the range of 100 nanometer to 1 micrometer) may be sufficient for the following planarization process.

In the following the remaining parts of the mask layer 210 and the formed oxide layer 540 are removed so that a planarized semiconductor wafer 100 having a smaller TTV than the original one (shown in FIG. 1) may be achieved as depicted in FIG. 5B. For example, the removing may be performed by applying HF to the wafer backside.

Figure 6A:
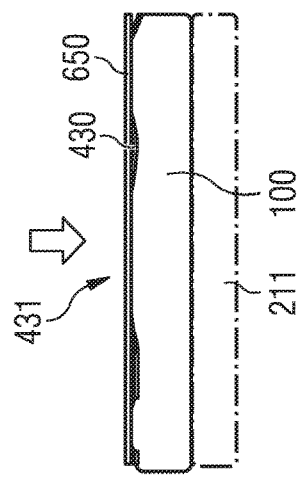
FIGS. 6A and 6B schematically show the semiconductor wafer of FIG. 4A after further processing steps according to another exemplary embodiment.
Figure 6B:
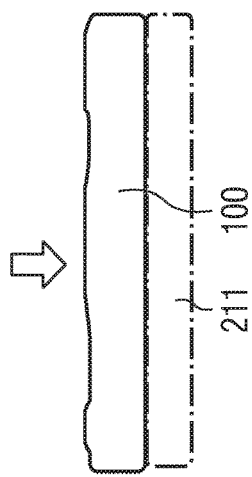

FIGS. 6A and 6B schematically show the semiconductor wafer of FIG. 4A after further processing steps according to another exemplary embodiment. Contrary to the example given in FIG. 5A and FIG. 5B the semiconductor layer is partly removed in a polishing process, e.g. a CMP process, by applying a slurry. By such an abrasive polishing process the semiconductor (e.g. silicon) of the wafer is typically removed faster, (e.g. three to four times faster) than the material of the mask layer (e.g. oxide or nitride). The polishing process is schematically indicated by a polishing pad 650 in FIG. 6A.

In the following also in this example the remaining parts of the mask layer 430 are removed exposing a planarized semiconductor wafer 100 having a smaller TTV than the original one, which is shown in FIG. 6B. For example, the removing may be performed by applying HF to the wafer backside.

Figure 7A:
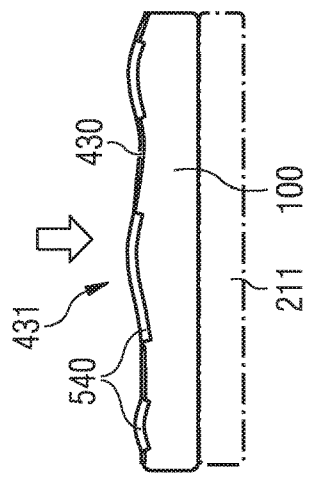
FIGS. 7A and 7B schematically show the semiconductor wafer of FIG. 4A after further processing steps according to yet another exemplary embodiment.
Figure 7B:
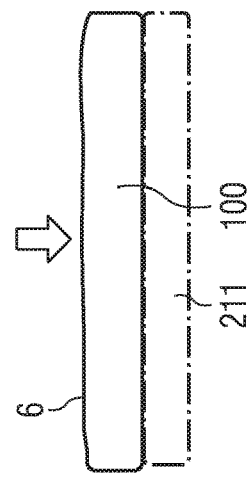

FIGS. 7A and 7B schematically show the semiconductor wafer of FIG. 4A after further processing steps according to yet another exemplary embodiment. In this example, the opened areas 431 are processed in a dry etch process, e.g. by applying a plasma to the exposed semiconductor material (e.g. silicon), wherein the remaining mask layer 433 functions again as a protection layer or hard mask layer.

In the following also in this example the remaining parts of the mask layer are removed exposing a planarized semiconductor wafer 100 having a smaller TTV than the original one, which is shown in FIG. 7B. For example, the removing may be performed by applying HF to the wafer backside.

It should also be noted that the term "comprising" does not exclude other elements or features and the "a" or "an" does not exclude a plurality. Also elements described in association with different embodiments may be combined. It should also be noted that reference signs shall not be construed as limiting the scope of the claims. While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of planarizing a semiconductor wafer, wherein the method comprises:
providing a semiconductor wafer comprising a surface;
forming a mask layer directly on the surface of the semiconductor wafer, wherein a thickness of the mask layer is smaller in thinning areas, which are to be thinned for planarizing, than in areas which are not to be thinned for planarizing,
wherein the forming of the mask layer comprises forming a raw mask layer and subsequently removing portions of the raw mask layer in the thinning areas by polishing, wherein a greater amount of material of the raw mask layer is removed in the thinning areas than in other areas; and
removing material of the semiconductor wafer in the thinning areas by a polishing process and an etching process, wherein the material of the semiconductor wafer is removed faster than the material of the mask layer.

2. The method according to claim 1, wherein the removing of the material of the semiconductor wafer is performed by a process selected out of the group consisting of:
dry etching;
wet etching;
dry polishing; and
wet polishing.

3. The method according to claim 1, wherein the polishing process is performed by applying a force below a predetermined threshold.

4. The method according to claim 1, wherein the polishing is performed by a polishing pad having a hardness of at least 50 Shore D.

5. The method according to claim 1, wherein the forming of the raw mask layer may be performed by forming a layer comprising at least one material out of the group consisting of:
a nitride;
an oxide;
a metal;
ceramics; and
a mixture thereof.

6. The method according to claim 1, wherein the mask layer forms a hard mask.

7. The method according to claim 1, further comprising removing remaining portions of the mask layer.

8. The method according to claim 1, further comprising chemically modifying a semiconductor material of the wafer in the thinning areas.

* * * * *